(12) United States Patent
Gong et al.

(10) Patent No.: US 10,516,776 B2
(45) Date of Patent: Dec. 24, 2019

(54) VOLUME ADJUSTING METHOD, SYSTEM, APPARATUS AND COMPUTER STORAGE MEDIUM

(71) Applicant: BAIDU ONLINE NETWORK TECHNOLOGY (BEIJING) CO., LTD., Beijing (CN)

(72) Inventors: Cunchen Gong, Beijing (CN); Haiwei Li, Beijing (CN); Pengfei Zhao, Beijing (CN)

(73) Assignee: BAIDU ONLINE NETWORK TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/528,485

(22) PCT Filed: Dec. 31, 2015

(86) PCT No.: PCT/CN2015/100103
§ 371 (c)(1),
(2) Date: May 19, 2017

(87) PCT Pub. No.: WO2016/184119
PCT Pub. Date: Nov. 24, 2016

(65) Prior Publication Data
US 2017/0264738 A1  Sep. 14, 2017

(30) Foreign Application Priority Data

May 18, 2015  (CN) .......................... 2015 1 0253308

(51) Int. Cl.
*H04M 3/00* (2006.01)
*H04M 1/725* (2006.01)

(52) U.S. Cl.
CPC .......... *H04M 3/002* (2013.01); *H04M 1/725* (2013.01)

(58) Field of Classification Search
CPC ................................................ H04M 2250/74
See application file for complete search history.

(56) References Cited

U.S. PATENT DOCUMENTS

| 7,869,768 B1 | 1/2011 | Vishlitzky | |
| 2005/0089172 A1* | 4/2005 | Fujimoto | G06F 21/32 380/275 |

(Continued)

FOREIGN PATENT DOCUMENTS

| CN | 1728234 A | 2/2006 |
| CN | 101917656 A | 12/2010 |

(Continued)

OTHER PUBLICATIONS

International Search Report for PCT/CN2015/100103 dated Mar. 24, 2016, and its English translation provided by WIPO.

(Continued)

*Primary Examiner* — Hsinchun Liao
(74) *Attorney, Agent, or Firm* — Ladas & Parry, LLP

(57) ABSTRACT

Embodiments of the present disclosure provide a volume adjusting method, system, apparatus and computer storage medium. In one aspect, in the embodiments of the present disclosure, the audio signal in the environment where the terminal lies is acquired, and then the volume of the information output by the terminal is adjusted according to the attributes of the audio signal. Hence, technical solutions provided by embodiments of the present disclosure can automatically adjust the volume of the information output by the terminal, lower volume adjustment operation costs and improve the volume adjusting efficiency.

16 Claims, 2 Drawing Sheets

(56) References Cited

U.S. PATENT DOCUMENTS

| | | | | |
|---|---|---|---|---|
| 2006/0282649 | A1* | 12/2006 | Malamud | H04L 63/0861 |
| | | | | 712/26 |
| 2008/0081697 | A1* | 4/2008 | Domville | G10L 19/0018 |
| | | | | 463/42 |
| 2014/0078404 | A1 | 3/2014 | Cheung | |
| 2015/0271206 | A1* | 9/2015 | Schultz | G06F 21/6236 |
| | | | | 726/3 |

FOREIGN PATENT DOCUMENTS

| | | | |
|---|---|---|---|
| CN | 102833505 | A | 12/2012 |
| CN | 102883024 | A | 1/2013 |
| CN | 103024630 | A | 4/2013 |
| CN | 103945062 | A | 7/2014 |
| CN | 104023144 | A | 9/2014 |
| CN | 104485911 | A | 4/2015 |
| CN | 104615252 | A | 5/2015 |
| CN | 104954555 | A | 9/2015 |
| EP | 3133799 | A1 | 2/2017 |
| JP | 2001007670 | A | 1/2001 |
| JP | 2001024741 | A | 1/2001 |
| JP | 2007110320 | A | 4/2007 |
| JP | 2009020626 | A | 1/2009 |
| JP | 2010263401 | A | 11/2010 |
| KR | 1020120018686 | A | 11/2013 |
| KR | 1020130039267 | A | 2/2014 |
| KR | 1020140121447 | A | 6/2016 |

OTHER PUBLICATIONS

Written Opinion of the International Search Authority for PCT/CN2015/100103 dated Mar. 24, 2016 and its English translation provided by Bing.Com Microsoft Translator.
Written Opinion of the International Searching Authority for PCT/CN2015/100103, dated Mar. 24, 2016, with English translation provided by WIPO.
International Preliminary Report on Patentability from PCT/CN2015/100103, dated Nov. 21, 2017, with English translation provided by WIPO.
First Office Action and Search Report from CN app. No. 201510253308.1, dated Apr. 24, 2017, with English translation provided by Global Dossier.
Second Office Action and Supplementary Search Report from CN app. No. 201510253308.1, dated Jan. 4, 2018, with English translation provided by Global Dossier.
Notification to Grant Patent Right for Invention from CN app. No. 201510253308.1, dated Jul. 26, 2018, with English translation provided by Global Dossier.
Extended European Search Report from EP app. No. 15892493.6, dated Nov. 14, 2018.
Notice of Reasons for Refusal from JP app. No. 2017-525019, dated Jun. 12, 2018, with English translation provided by Global Dossier.
Notice of Reasons for Refusal from JP app. No. 2017-525019, dated Oct. 2, 2018, with English translation provided by Global Dossier.
Decision to Grant a Patent from JP app. No. 2017-525019, dated Jan. 18, 2019, with English translation provided by Global Dossier.
Notification of Reasons for Refusal from KR app. No. 2017-7013076 dated Mar. 20, 2018, with English translation provided by Global Dossier.
Notification of Reasons for Refusal from KR app. No. 2017-7013076, dated Aug. 31, 2019, with English translation provided by Global Dossier.
Notice of Allowance from KR app. No. 2017-7013076, dated Feb. 20, 2019, with English translation provided by Global Dossier.

* cited by examiner

VOLUME ADJUSTING METHOD, SYSTEM, APPARATUS AND COMPUTER STORAGE MEDIUM

The present application is the U.S. National Phase of PCT Application PCT/CN2015/100103 filed on Dec. 31, 2015, which claims priority to the Chinese patent application No. 201510253308.1 entitled "Volume Adjusting Method and System" filed on May 18, 2015, the disclosures of which are hereby incorporated by reference in their entireties.

FIELD OF THE DISCLOSURE

The present disclosure relates to the technical field of mobile communications, and particularly to a volume adjusting method, system, apparatus and computer storage medium.

BACKGROUND OF THE DISCLOSURE

As terminals prevail and are intelligentized and the Internet technologies develop swiftly, more functions are integrated on the terminals so that diverse applications are installed on the terminals. At present, more and more users use various service provided by applications on the terminals.

At present, users often use terminals to listen to music, browse video or make a telephone call. When a volume of other sound in the environment where a terminal lies gets bigger or smaller, the user needs to manually adjust the volume of the information output by the terminal. Or when someone comes to talk with the user, a door bell rings or there is whistling, the user needs to manually take down the earphone or manually adjust the volume of the information output by the terminal to hear these sound clearly. However, manually adjusting the volume of the information output by the terminal in the prior art causes higher volume adjustment operating costs and lower a volume adjusting efficiency.

SUMMARY OF THE DISCLOSURE

In view of the above, embodiments of the present disclosure provide a volume adjusting method, system, apparatus and computer storage medium, which can automatically adjust the volume of information output by the terminal, lower the volume adjustment operating costs and improve the volume adjusting efficiency.

According to an aspect of the present disclosure, there is provided a volume adjusting method, comprising:

acquiring an audio signal in an environment where a terminal lies;

adjusting a volume of information output by the terminal according to attributes of the audio signal.

The above aspect and any possible implementation mode further provide an implementation mode: the attributes of the audio signal comprise a signal intensity of the audio signal; the adjusting the volume of information output by the terminal according to the attributes of the audio signal comprises:

acquiring a signal intensity of the audio signal;

if the signal intensity of the audio signal is larger than a preset first threshold, turning up the volume of the information output by the terminal; or, if the signal intensity of the audio signal is smaller than a preset second threshold, turning down the volume of the information output by the terminal;

wherein the first threshold is larger than the second threshold.

The above aspect and any possible implementation mode further provide an implementation mode: the attributes of the audio signal comprise a type of the audio signal, and the adjusting the volume of information output by the terminal according to the attributes of the audio signal comprises:

the terminal sending the audio signal to a server so that the server performs audio recognition for the audio signal to obtain the type of the audio signal;

the terminal receiving the type of the audio signal sent by the server;

if the type of the audio signal belongs to a preset target type, the terminal turning down the volume of the information output by the terminal.

The above aspect and any possible implementation mode further provide an implementation mode: the method further comprises:

the terminal keeping time, and turning up the volume of the information output by the terminal to an original volume after the kept time length reaches a preset time length.

The above aspect and any possible implementation mode further provide an implementation mode: the volume of the information output by the terminal comprises at least one of a volume of information output by a loudspeaker in the terminal and a volume of information output by a loudspeaker in an earphone connected with the terminal.

According to another aspect of embodiments of the present disclosure, there is provided a volume adjusting system, comprising:

a signal acquiring unit configured to acquire an audio signal in an environment where a terminal lies;

a volume processing unit configured to adjust a volume of information output by the terminal according to attributes of the audio signal.

The above aspect and any possible implementation mode further provide an implementation mode: the attributes of the audio signal comprise a signal intensity of the audio signal; the volume processing unit is specifically configured to:

acquire a signal intensity of the audio signal;

if the signal intensity of the audio signal is larger than a preset first threshold, turn up the volume of the information output by the terminal; or, if the signal intensity of the audio signal is smaller than a preset second threshold, turn down the volume of the information output by the terminal;

wherein the first threshold is larger than the second threshold.

The above aspect and any possible implementation mode further provide an implementation mode: the attributes of the audio signal comprise a type of the audio signal, and the volume processing unit is specifically configured to:

send the audio signal to a server so that the server performs audio recognition for the audio signal to obtain the type of the audio signal;

receive the type of the audio signal sent by the server;

if the type of the audio signal belongs to a preset target type, turn down the volume of the information output by the terminal.

The above aspect and any possible implementation mode further provide an implementation mode: the volume processing unit is further used to keep time, and turn up the volume of the information output by the terminal to an original volume after the kept time length reaches a preset time length.

The above aspect and any possible implementation mode further provide an implementation mode: the volume of the information output by the terminal comprises at least one of a volume of information output by a loudspeaker in the terminal and a volume of information output by a loudspeaker in an earphone connected with the terminal.

As can be seen from the above technical solutions, embodiments of the present disclosure have the following advantageous effects:

In the embodiments of the present disclosure, the audio signal in the environment where the terminal lies is acquired, and then the volume of the information output by the terminal is adjusted according to the attributes of the audio signal. Hence, technical solutions provided by embodiments of the present disclosure can implement automatic adjustment of the volume of the information output by the terminal. As compared with the manner of manually adjusting the volume of the information output by the terminal in the prior art, the technical solutions provided by embodiments of the present disclosure can lower volume adjustment operation costs and improve the volume adjusting efficiency, bringing about more convenience to the user and boosting the user's experience.

DETAILED DESCRIPTION OF PREFERRED EMBODIMENTS

The present disclosure will be described in detail in conjunction with figures and specific embodiments to make objectives, technical solutions and advantages of the present disclosure more apparent.

It should be appreciated that embodiments described here are only partial embodiments of the present disclosure, not all embodiments. Based on embodiments in the present disclosure, all other embodiments obtained by those having ordinary skill in the art without making inventive efforts all fall within the protection scope of the present disclosure.

Terms used in embodiments of the present disclosure are only intended to describe specific embodiments, not to limit the present disclosure. Singular forms "a", "said" and "the" used in embodiments and claims of the present disclosure are also intended to include plural forms, unless other senses are clearly defined in the context.

It should be appreciated that the term "and/or" used in the text is only an association relationship depicting associated objects and represents that three relations might exist, for example, A and/or B may represents three cases, namely, A exists individually, both A and B coexist, and B exists individually. In addition, the symbol "/" in the text generally indicates associated objects before and after the symbol are in an "or" relationship.

Depending on the context, the word "if" as used herein may be construed as "at the time when . . . " or "when . . . " or "responsive to determining" or "responsive to detecting". Similarly, depending on the context, phrases "if . . . is determined" or "if . . . (stated condition or event) is detected" may be construed as "when . . . is determined" or "responsive to determining" or "when . . . (stated condition or event) is detected" or "responsive to detecting (stated condition or event)".

Embodiment 1

Figure 1:
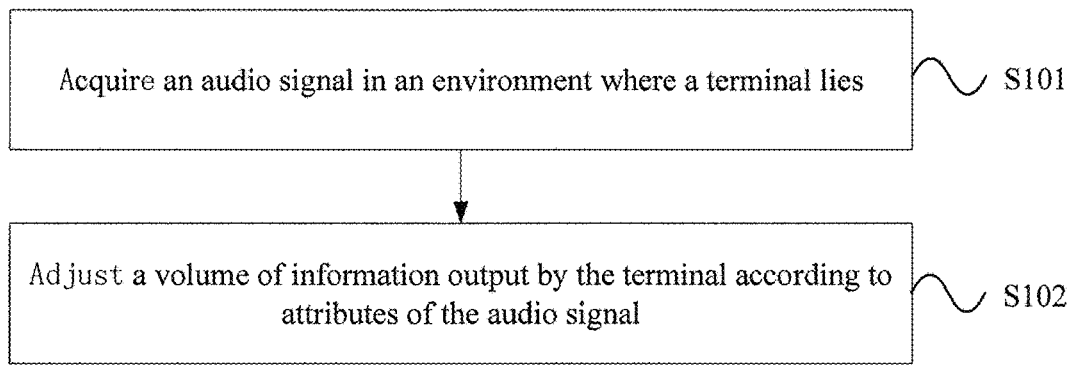
FIG. 1 is a flow chart of a volume adjusting method according to an embodiment of the present disclosure.

The present embodiment of the present disclosure provides a volume adjusting method. Referring to FIG. 1, FIG. 1 is a flow chart of a volume adjusting method according to an embodiment of the present disclosure. As shown in FIG. 1, the method comprises the following steps:

S101: acquiring an audio signal in an environment where a terminal lies.

S102: adjusting a volume of information output by the terminal according to attributes of the audio signal.

It needs to be appreciated that the terminal in the embodiment of the present disclosure comprises but is not limited to a Personal Computer (PC), a Personal Digital Assistant (PDA), a wireless handheld device, a tablet computer, a mobile phone, an MP3 player, an MP4 player and the like.

Embodiment 2

Based on the volume adjusting method according to Embodiment 1, Embodiment 2 of the present disclosure specifically describes the step S101 of acquiring an audio signal in the environment where the terminal lies. The step may specifically comprise:

Exemplarily, in the embodiment of the present disclosure, the step of acquiring an audio signal in the environment where the terminal lies may comprise but is not limited to: the terminal acquires the audio signal in the environment where the terminal lies when the terminal plays an audio or video or the user is using the terminal to make a phone call.

Preferably, the terminal may use a microphone located on the terminal to acquire the audio signal in the environment where the terminal lies, or the terminal may use a microphone located on an earphone connected with the terminal to acquire the audio signal in the environment where the terminal lies.

Preferably, the earphone connected with the terminal may comprise but is not limited to: a wired earphone or a Blue-tooth earphone.

Embodiment 3

Figure 2A:
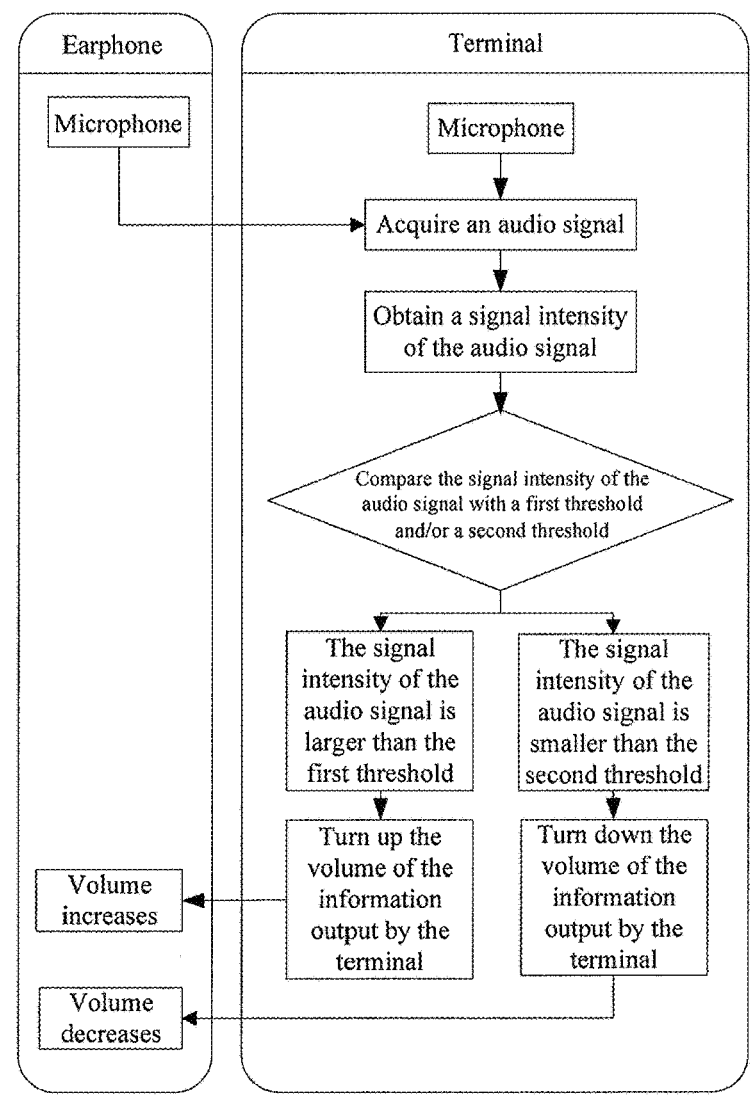
FIG. 2(a)-FIG. 2(b) are exemplary diagrams of adjusting the volume of information output by a terminal according to attributes of audio signals according to an embodiment of the present disclosure.
Figure 2B:
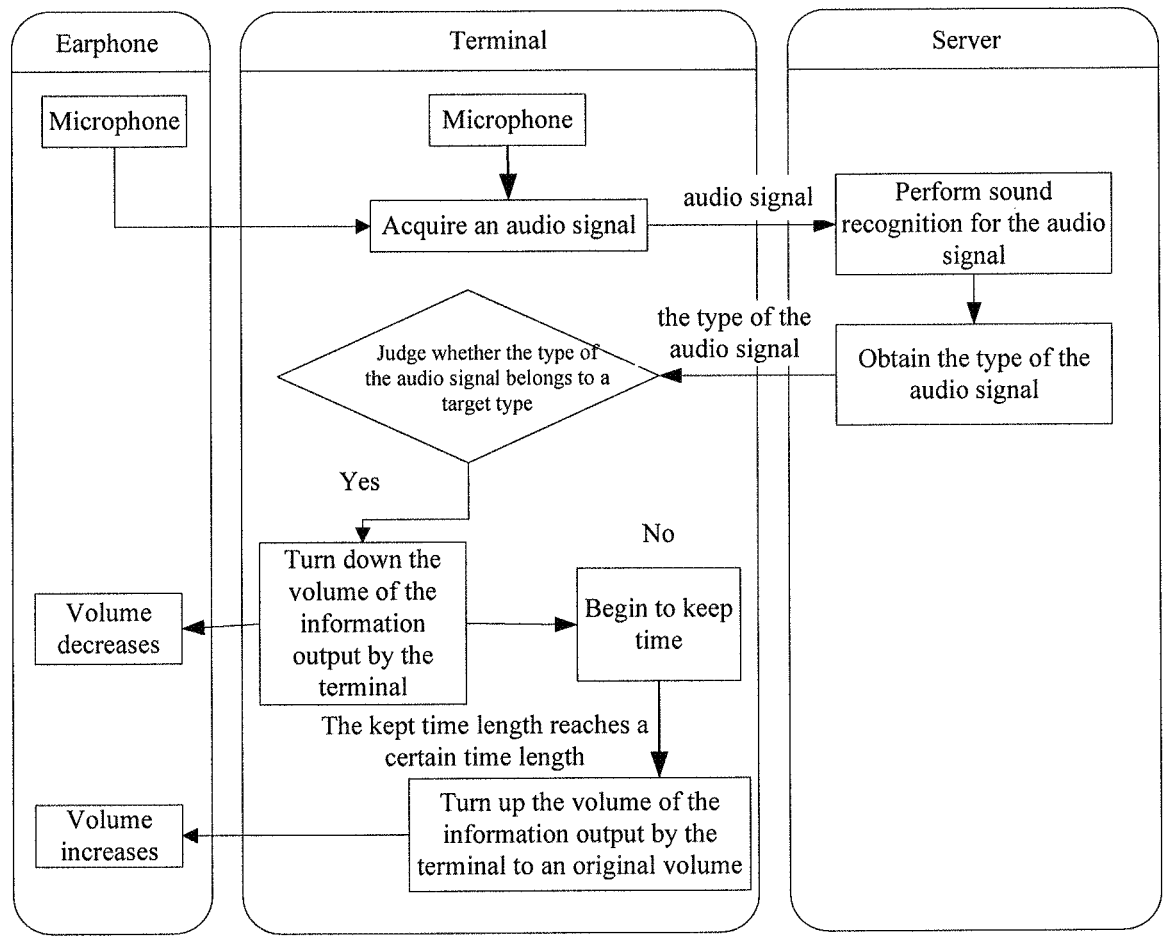

Based on the volume adjusting method according to Embodiment 1 as well as Embodiment 2, Embodiment 3 of the present disclosure specifically describes the step 102 of adjusting a volume of information output by the terminal according to attributes of the audio signal. The step may specifically comprise:

Referring to FIG. 2(a)-FIG. 2(b), they are exemplary diagrams of adjusting the volume of information output by the terminal according to attributes of the audio signal according to an embodiment of the present disclosure. As shown in these figures, in the embodiment of the present disclosure, the step of adjusting a volume of information output by the terminal according to attributes of the audio signal may comprise but is not limited to the following two types:

The first type: as show in FIG. 2(a), if the attributes of the audio signal comprise a signal intensity of the audio signal, the terminal may first acquire the signal intensity of the audio signal. Then, the terminal compares the signal intensity of the audio signal and a preset first threshold, and/or, compares the signal intensity of the audio signal with a preset second threshold, wherein the first threshold is larger than the second threshold.

As shown in FIG. 2(a), if the signal intensity of the audio signal is judged larger than the preset first threshold, this indicates that the environment where the terminal lies is noisy, and the volume of the information output by the terminal is turned up to enable the user to hear the information output by the terminal. Alternatively, if the signal intensity of the audio signal is smaller than the preset second threshold, this indicates that the environment where the terminal lies is relatively quiet, and the volume of the information output by the terminal is turned down.

Exemplarily, it is feasible to, according to the signal intensity of the audio signal and correspondence relationship between the signal intensity and the volume information, determine the volume information corresponding to the signal intensity, and thereby, according to the volume information, turn up the volume of the information output by the terminal, or turn down the volume of the terminal information. As such, when the environment where the terminal lies is noisier, the volume of the information output by the terminal is higher; when the environment where the terminal lies is quieter, the volume of the information output by the terminal is lower. The step of adjusting the volume of the information output by the terminal is not particularly limited in the embodiment of the present disclosure.

Exemplarily, the step of acquiring the signal intensity of the audio signal may comprises but is not limited to:

acquiring the signal intensity of the audio signal by using the following equations:

$$E(n) = \frac{1}{N} \sum_{k=1}^{N} |lg(S_k(n))|$$

$$AE = \frac{1}{N_p} \sum_{k=1}^{N_p} E(n)$$

wherein, E(n) represents the signal intensity of the audio signal of the nth frame, AE represents a signal intensity of the audio signal, $S_k(n)$ represents Fast Fourier Transformation (TFT) of the kth frame in the collected audio signal, $N_p$ represents a length of the collected audio signal, and N represents a frame length of the collected audio signal.

It needs to be appreciated that the values of the first threshold and second threshold may be set in conjunction with actual situations upon implementation and are not particularly limited in the embodiment of the present disclosure.

The second type, as shown in FIG. 2(b), if the attributes of the audio signal comprise the type of the audio signal, the terminal sends the audio signal to a server so that the server performs audio recognition for the audio signal to obtain the type of the audio signal. Then, the terminal receives the type of the audio signal sent by the server, and the terminal judges whether the type of the audio signal belongs to a preset target type. If the terminal judges that the type of the audio signal belongs to the preset target type, this indicates that the audio signal is the audio signal to be particularly noticed by the user, and the terminal turns down the volume of the information output by the terminal so that the user can hear the audio signal clearly. On the contrary, if the terminal judges that the type of the audio signal does not belong to the preset target type, this indicates that the audio signal needn't be particularly noticed by the user, and the terminal does not adjust the volume of the information output by the terminal.

It may be appreciated that in the embodiment of the present disclosure, when the acquired audio signal is determined as belonging to the audio signal to be particularly noticed by the user, the volume of the information output by the terminal may be automatically turned down to enable the user to hear the audio signal to be heard in time, thereby avoiding the user's manual turn-down of the volume of the information output by the terminal, lowering the user's operation costs and improving the volume adjusting efficiency.

Preferably, the terminal turns down the volume of the information output by the terminal may be as follows: the terminal properly turns down the volume of the information output by the terminal; or, the terminal directly tunes the volume of the information output by the terminal to a mute state, namely, the volume of the information output by the terminal is turned down to 0.

For example, the target type may comprise but is not limited to: a voice signal sent from a user, a phone ring, a whistle or door bell ring.

Preferably, several candidate types may be provided to the user, and then the target type is determined according to the user's setting in the candidate types. As such, a volume adjustment application scenario may be adjusted through simple and convenient setting, which exhibits a higher flexibility.

Preferably, the audio recognition may comprise vocal print recognition and sound recognition.

Preferably, the vocal print recognition may be performed for the audio signal first to determine whether the audio signal is a voice signal sent by the user. If the audio signal is judged as not being the voice signal sent by the user, the sound recognition is performed for the audio signal to obtain the type of the audio signal.

Exemplarily, the method of performing vocal print recognition for the audio signal may comprise but is not limited to:

pre-recording the user's voice signal as a sample signal, then extracting vocal print feature information from the sample signal, and building a vocal print recognition model according to the vocal print feature information.

After obtaining the audio signal, extracting the vocal print feature information of the audio signal, and then using the vocal print recognition model to recognize the vocal print feature information of the audio signal; if judging that the audio signal matches with the user's voice signal according to the vocal print feature information of the audio signal and the vocal print feature information of the user's voice signal, determining that the audio signal is the user's voice; on the contrary, if judging that the audio signal does not match with the user's voice signal, determining that the audio signal is not the user's voice, and further performing sound recognition for the audio signal to obtain the type of the audio signal.

Exemplarily, the method of performing sound recognition for the audio signal may comprise but is not limited to:

pre-acquiring a sample signal such as phone ring, whistle or door bell ring, then performing vectorization processing for the sample signal to extract sample feature vector information of the sample signal, and using the sample feature vector information to build a sound recognition model.

After obtaining the audio signal, using the sound recognition model to recognize the audio signal, e.g., extracting feature vector information of the audio signal from the obtained audio signal, then performing similarity calculation for the feature vector information and the sample feature vector information in the sound recognition model, and determining the type of the audio signal according to the sample feature vector information with the highest similarity.

Optionally, after the terminal turns down the volume of the information output by the terminal, the terminal may use a timer to keep time, and turns up the volume of the information output by the terminal to an original volume after the kept time length reaches a preset time length, thereby implementing automatic restoration to the volume of the information output by the terminal after a certain period of time.

Preferably, in the embodiment of the present disclosure, the volume of the information output by the terminal may comprise but is not limited to: at least one of a volume of information output by a loudspeaker in the terminal and a volume of information output by a loudspeaker in an earphone connected with the terminal.

It needs to be appreciated that a subject for executing the above S101-S102 may be an audio adjusting system. The volume adjusting system may be located in an application which may be pre-installed in the terminal, and activation and deactivation of the volume adjusting system may be controlled via a switch button in the application program. If the volume adjusting system is activated, automatic adjustment for the volume of the information output by the terminal may be implemented by using the above method.

Embodiments of the present invention further provide an apparatus for implementing the steps and method in the above method embodiments.

Figure 3:
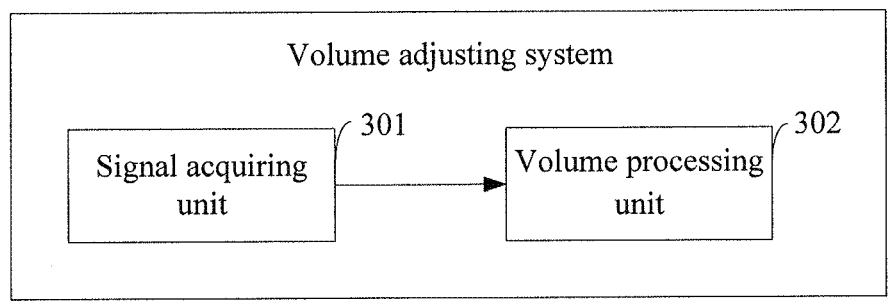
FIG. 3 is a block diagram of a volume adjusting system according to an embodiment of the present disclosure.

Referring to FIG. 3, it is a block diagram of a volume adjusting system according to an embodiment of the present disclosure. As shown in the figure, the system comprises:

a signal acquiring unit 301 configured to acquire an audio signal in an environment where a terminal lies;

a volume processing unit 302 configured to adjust a volume of information output by the terminal according to attributes of the audio signal.

Preferably, the attributes of the audio signal comprise a signal intensity of the audio signal; the volume processing unit 302 is specifically configured to:

acquire a signal intensity of the audio signal;

if the signal intensity of the audio signal is larger than a preset first threshold, turn up the volume of the information output by the terminal; or, if the signal intensity of the audio signal is smaller than a preset second threshold, turn down the volume of the information output by the terminal;

wherein the first threshold is larger than the second threshold.

Preferably, the attributes of the audio signal comprise a type of the audio signal, and the volume processing unit 302 is specifically configured to:

send the audio signal to a server so that the server performs audio recognition for the audio signal to obtain the type of the audio signal;

receive the type of the audio signal sent by the server;

if the type of the audio signal belongs to a preset target type, turn down the volume of the information output by the terminal.

Optionally, the volume processing unit 302 is further used to keep time, and turn up the volume of the information output by the terminal to an original volume after the kept time length reaches a preset time length.

Preferably, the volume of the information output by the terminal comprises at least one of a volume of information output by a loudspeaker in the terminal and a volume of information output by a loudspeaker in an earphone connected with the terminal.

Since units in the present embodiment can execute the method shown in FIG. 1, reference may be made to related depictions of FIG. 1 for portions not described in detail in the present embodiment.

The technical solutions of embodiments of the present invention have the following advantageous effects:

In the embodiments of the present disclosure, the audio signal in the environment where the terminal lies is acquired, and then the volume of the information output by the terminal is adjusted according to the attributes of the audio signal. Hence, technical solutions provided by embodiments of the present disclosure can implement automatic adjustment of the volume of the information output by the terminal. As compared with the manner of manually adjusting the volume of the information output by the terminal in the prior art, the technical solutions provided by embodiments of the present disclosure can lower volume adjustment operation costs and improve the volume adjusting efficiency, bringing about more convenience to the user and boosting the user's experience.

Furthermore, in embodiments of the present disclosure, if is found that the signal intensity of the audio signal in the environment where the terminal lies is larger, the volume of the information output by the terminal may be turned up automatically and in time to prevent the user from influence of the noisy environment so that the user can still hear the information output by the terminal. If is found that the signal intensity of the audio signal in the environment where the terminal lies is larger, the volume of the information output by the terminal may be turned down automatically and in time to avoid successive volume of the information output by the terminal which affects the user.

Furthermore, in the embodiments of the present disclosure, the audio signal in the environment where the terminal lies may be recognized; if the type of the audio signal needs to be particularly noticed, the volume of the information output by the terminal is turned down to enable the user to hear the audio signal in time.

In the prior art, there is a solution of implementing automatic volume adjustment by adding a hardware module on the terminal or earphone. However, the construction of the earphone in this solution is very complicated, hardware costs are higher, and universality is lower. Furthermore, the volume can only be adjusted according to the magnitude of the noise in the environment, and it is impossible to recognize the audio signal to be particularly noticed by the user and to effectively adjust the volume. Technical solutions provided by the embodiments of the present disclosure may be implemented by using software and only by installing corresponding applications in the terminal with lower costs, and they can support recognition for specific audio signals and automatically adjust the volume according to the specific audio signals.

Those skilled in the art can clearly understand that for purpose of convenience and brevity of depictions, reference may be made to corresponding procedures in the aforesaid method embodiments for specific operation procedures of the system, apparatus and units described above, which will not be detailed any more.

In the embodiments provided by the present disclosure, it should be understood that the revealed system, apparatus and method can be implemented through other ways. For example, the above-described embodiments for the apparatus are only exemplary, e.g., the division of the units is merely logical one, and, in reality, they can be divided in other ways upon implementation. For example, a plurality of units or components may be combined or integrated into another system, or some features may be neglected or not executed. In addition, mutual coupling or direct coupling or communicative connection as displayed or discussed may be indirect coupling or communicative connection performed via some interfaces, means or units and may be electrical, mechanical or in other forms.

The units described as separate parts may be or may not be physically separated, the parts shown as units may be or may not be physical units, i.e., they can be located in one place, or distributed in a plurality of network units. One can select some or all the units to achieve the purpose of the embodiment according to the actual needs.

Further, in the embodiments of the present disclosure, functional units can be integrated in one processing unit, or they can be separate physical presences; or two or more units can be integrated in one unit. The integrated unit described above can be implemented in the form of hardware, or they can be implemented with hardware plus software functional units.

The aforementioned integrated unit in the form of software function units may be stored in a computer readable storage medium. The aforementioned software function units are stored in a storage medium, including several instructions to instruct a computer device (a personal computer, server, or network equipment, etc.) or processor to perform some steps of the method described in the various embodiments of the present disclosure. The aforementioned storage medium includes various media that may store program codes, such as U disk, removable hard disk, read-only memory (ROM), a random access memory (RAM), magnetic disk, or an optical disk.

What are stated above are only preferred embodiments of the present invention, not intended to limit the invention. Any modifications, equivalent replacements, improvements and the like made within the spirit and principles of the present invention, should all be included in the present invention within the scope of protection.

What is claimed is:

1. A volume adjusting method, wherein the method comprises:
    acquiring an audio signal in an environment where a terminal lies;
    determining whether the audio signal is a voice signal sent by a user, by performing vocal print recognition, when the audio signal is not a voice signal sent by a user;
    acquiring type information of the audio signal, when the type of the audio signal belongs to a reset target type, turning down the volume of the information output by the terminal, so that the user can hear the audio signal clearly, when the type of the audio signal does not belong to the preset target type, the terminal does not adjust the volume.

2. The method according to claim 1, further comprises:
    acquiring a signal intensity of the audio signal;
    when the signal intensity of the audio signal is larger than a preset first threshold, turning up the volume of the information output by the terminal; or, when the signal intensity of the audio signal is smaller than a preset second threshold, turning down the volume of the information output by the terminal;
    wherein the first threshold is larger than the second threshold.

3. The method according to claim 1, further comprises:
    sending the audio signal to a server;
    receiving type information of the audio signal returned after the server performs audio recognition for the audio signal;
    when the type of the audio signal belongs to a preset target type, turning down the volume of the information output by the terminal.

4. The method according to claim 3, wherein the method further comprises:
    after turning down the volume of the information output by the terminal for a preset time length, turning up the volume of the information output by the terminal to an original volume.

5. The method according to claim 1, wherein the volume of the information output by the terminal comprises at least one of a volume of information output by a loudspeaker in the terminal and a volume of information output by a loudspeaker in an earphone connected with the terminal.

6. The method according to claim 1, wherein the preset target type is selected from a group comprising a voice signal from a user, a phone ring, a whistle or doorbell ring.

7. An apparatus, comprising
    one or more processor,
    a memory;
    one or more programs stored in the memory and configured to execute the following operation when executed by the one or more processors:
    acquiring an audio signal in an environment where a terminal lies;
    determining whether the audio signal is a voice signal sent by a user, by performing vocal print recognition, when the audio signal is not a voice signal sent by a user,
    acquiring type information of the audio signal, when the type of the audio signal belongs to a preset target type, turning down the volume of the information output by the terminal, so that the user can hear the audio signal clearly, when the type of the audio signal does not belong to the preset target type, the terminal does not adjust the volume.

8. The Apparatus according to claim 7, wherein the operation further comprises:
    acquiring a signal intensity of the audio signal;
    when the signal intensity of the audio signal is larger than a preset first threshold, turning up the volume of the information output by the terminal; or, when the signal intensity of the audio signal is smaller than a preset second threshold, turning down the volume of the information output by the terminal;
    wherein the first threshold is larger than the second threshold.

9. The Apparatus according to claim 7, wherein the operation further comprises:
    sending the audio signal to a server,
    receiving type information of the audio signal returned after the server performs audio recognition for the audio signal;
    when the type of the audio signal belongs to a preset target type, turning down the volume of the information output by the terminal.

10. The Apparatus according to claim 9, wherein the operation further comprises:
    after turning down the volume of the information output by the terminal for a preset time length, turning up the volume of the information output by the terminal to an original volume.

11. The Apparatus according to claim 7, wherein the volume of the information output by the terminal comprises at least one of a volume of information output by a loudspeaker in the terminal and a volume of information output by a loudspeaker in an earphone connected with the terminal.

12. A non-transitory computer storage medium in which one or more programs are stored, an apparatus being enabled to execute the following operation when said one or more programs are executed by the apparatus:
   acquiring an audio signal in an environment where a terminal lies;
   determining whether the audio signal is a voice signal sent by a user, by performing vocal mint recognition, when the audio signal is not a voice signal sent by a user;
   acquiring type information of the audio signal, when the type of the audio signal belongs to a preset target type, turning down the volume of the information output by the terminal, so that the user can hear the audio signal clearly, when the type of the audio signal does not belong to the preset target type, the terminal does not adjust the volume.

13. The non-transitory computer storage medium according to claim 12, wherein the operation further comprises:
   acquiring a signal intensity of the audio signal;
   when the signal intensity of the audio signal is larger than a preset first threshold, turning up the volume of the information output by the terminal; or, when the signal intensity of the audio signal is smaller than a preset second threshold, turning down the volume of the information output by the terminal;
   wherein the first threshold is larger than the second threshold.

14. The non-transitory computer storage medium according to claim 12, wherein the operation further comprises:
   sending the audio signal to a server,
   receiving type information of the audio signal returned after the server performs audio recognition for the audio signal;
   when the type of the audio signal belongs to a preset target type, turning down the volume of the information output by the terminal.

15. The non-transitory computer storage medium according to claim 14, wherein the operation further comprises:
   after turning down the volume of the information output by the terminal for a preset time length, turning up the volume of the information output by the terminal to an original volume.

16. The non-transitory computer storage medium according to claim 12, wherein the volume of the information output by the terminal comprises at least one of a volume of information output by a loudspeaker in the terminal and a volume of information output by a loudspeaker in an earphone connected with the terminal.

* * * * *